(12) United States Patent
Yang et al.

(10) Patent No.: US 7,061,106 B2
(45) Date of Patent: Jun. 13, 2006

(54) STRUCTURE OF IMAGE SENSOR MODULE AND A METHOD FOR MANUFACTURING OF WAFER LEVEL PACKAGE

(75) Inventors: Wen-Kun Yang, Hsinchu (TW); Wen-Pin Yang, Hsinchu (TW)

(73) Assignee: Advanced Chip Engineering Technology Inc., Hsinchu (TW)

( * ) Notice: Subject to any disclaimer, the term of this patent is extended or adjusted under 35 U.S.C. 154(b) by 100 days.

(21) Appl. No.: 10/833,345

(22) Filed: Apr. 28, 2004

(65) Prior Publication Data

US 2005/0242408 A1 Nov. 3, 2005

(51) Int. Cl.
*H01L 23/34* (2006.01)

(52) U.S. Cl. .................. 257/723; 257/678; 257/749; 257/680; 257/428

(58) Field of Classification Search ............... 257/723, 257/678, 749, 680, 428
See application file for complete search history.

(56) References Cited

U.S. PATENT DOCUMENTS 4,055,761 A * 10/1977 Shimomura ............. 250/239
6,414,299 B1 * 7/2002 Churei .................... 250/214.1
6,483,030 B1 * 11/2002 Glenn et al. .............. 174/52.4
2003/0057359 A1 * 3/2003 Webster ..................... 250/216
2005/0184219 A1 * 8/2005 Kirby ...................... 250/208.1
2005/0236684 A1 * 10/2005 Chen et al. ................ 257/433

* cited by examiner

*Primary Examiner*—Bradley K. Smith
*Assistant Examiner*—Douglas M. Menz
(74) *Attorney, Agent, or Firm*—Nath & Associates PLLC; Gregory B. Kang; Teresa M. Arroyo

(57) ABSTRACT

The present invention discloses an image sensor module and forming method of wafer level package. The image sensor module comprises an isolating base, a wafer level package, a lens holder, and a F.P.C.. The wafer level package having a plurality of image sensor dies and a plurality of solder balls is attached to the isolating base. A plurality of lens are placed in the lens holder, and the lens holder is located on the image sensor dies. The lens holder is placed in the F.P.C., and the F.P.C. has a plurality of solder joints coupled to the solder balls for conveniently transmitting signal of the image sensor dies. Moreover, the image sensor dies may be packaged with passive components or other dies with a side by side structure or a stacking structure.

19 Claims, 8 Drawing Sheets

STRUCTURE OF IMAGE SENSOR MODULE AND A METHOD FOR MANUFACTURING OF WAFER LEVEL PACKAGE

BACKGROUND OF THE INVENTION

1. Field of the Invention

This invention relates to an image sensor module, and more particularly to an image sensor module and a structure and method for manufacturing of wafer level package that can lower the cost, raise the yield and reliability.

2. Description of the Prior Art

The semiconductor technologies are developing very fast, and especially semiconductor dies have a tendency toward miniaturization. However, the requirements for the functions of the semiconductor dies have an opposite tendency to variety. Namely, the semiconductor dies must have more I/O pads into a smaller area, so the density of the pins is raised quickly. It causes the packaging for the semiconductor dies to become more difficult and decrease the yield.

The main purpose of the package structure is to protect the dies from outside damages. Furthermore, the heat generated by the dies must be diffused efficiently through the package structure to ensure the operation the dies.

The earlier lead frame package technology is already not suitable for the advanced semiconductor dies due to the density of the pins thereof is too high. Hence, a new package technology of BGA (Ball Grid Array) has been developed to satisfy the packaging requirement for the advanced semiconductor dies. The BGA package has an advantage of that the spherical pins has a shorter pitch than that of the lead frame package and the pins is hard to damage and deform. In addition, the shorter signal transmitting distance benefits to raise the operating frequency to conform to the requirement of faster efficiency. Most of the package technologies divide dies on a wafer into respective dies and then to package and test the die respectively. Another package technology, called "Wafer Level Package (WLP)", can package the dies on a wafer before dividing the dies into respective dies. The WLP technology has some advantages, such as a shorter producing cycle time, lower cost, and no need to under-fill or molding.

The dies are, such as image sensor dies. Now, the image sensor module is formed by using a method of COB or LCC. The one drawback of the method of the COB is lower yield rate during packaging process due to particle contamination on sensing area. Besides, the drawbacks of the method of the LCC are higher packaging cost due to materials and lower yield rate during packaging process due to particle contamination on sensing area. Moreover, SHELL CASE company also develops wafer level package technique, the image sensor dies packaged by the SHELL CASE is higher cost due to requiring two glass plate and complicate process. And, the transparency is bad due to epoxy wearing out, and the potential reliability may be reduced.

Therefore, the present invention has been made in view of the above problems in the prior arts, and it is an objective of the present invention to provide a new image sensor module.

SUMMARY OF THE INVENTION

Therefore, the present invention has been made in view of the above problems in the prior arts, and it is an objective of the present invention to provide an image sensor module and a structure and method for manufacturing of wafer level package.

Another objective of the present invention is to provide an image sensor module to conveniently make a final testing of the wafer level package.

Still objective of the present invention is to lower the cost of the package structure.

Still another objective of the present invention is to raise the yield of the package structure.

Another objective of the present invention is to provide package structure with a high yield and reliability, and it can apply for semiconductor industry and LCD industry.

As aforementioned, the present invention provides an image sensor module and a method for manufacturing of wafer level package. The image sensor module comprises an isolating base, a wafer level package, a lens holder, and a F.P.C.. The wafer level package having a plurality of image sensor dies and a plurality of solder balls is attached to the isolating base. A plurality of lens are placed in the lens holder, and the lens holder is located on the image sensor dies. The lens holder is placed in the F.P.C., and the F.P.C. has a plurality of solder joints coupled to the solder balls for conveniently transmitting signal of the image sensor dies. Moreover, the image sensor dies may be packaged with passive components or other dies with a side by side structure or a stacking structure.

The present invention also provides a wafer level package structure. The package structure comprises an isolating base, a first die and a second die, a first dielectric layer, a second dielectric layer, a contact conductive layer, an isolation layer and solder balls. The first die and second die are adhered to the isolating base. The first dielectric layer is formed on the isolating base and filled in a space except the first die and second die on the isolating base. The second dielectric layer is formed on the second die. The contact conductive layer is formed on a first metal pad of the first die and a second metal pad of the second die to cover the first metal pad and second metal pad, and the contact conductive layer is electrically coupled to the first metal pad and second metal pad, respectively. The isolation layer is formed on the contact conductive layer, and the isolation layer has openings formed on the contact conductive layer. The solder balls are welded on the openings and electrically coupled with the contact conductive layer, respectively. The first die is selected from DSP die, acctive die, passive die, supprot die, CPU die or processor die, and the second die is a CMOS image sensor die. The image sensor die is packaged with the DSP die, acctive die, passive die, supprot die, CPU die or processor die with a side by side structure.

The present invention also provides a wafer level package structure. The package structure comprises an isolating base, a first die and a second die, a first dielectric layer, a second dielectric layer, a first and second contact conductive layer, an isolation layer and solder balls. The first die is adhered to the isolating base. The first dielectric layer is formed on the isolating base and filled in a space except the first die on the isolating base. The first contact conductive layer is formed on a first metal pad of the first die to cover the first metal pad, and the first contact conductive layer is electrically coupled to the first metal pad, respectively. The second die is adhered to the first die. The second dielectric layer is formed on the first dielectric layer and filled in a space except the second die, and the second dielectric layer has via hole formed on the first contact conductive layer. The third dielectric layer is formed on the second die. The second contact conductive layer is formed on a second metal pad of the second die and filled in said via hole to cover the second metal pad, and the second contact conductive layer is electrically coupled to the second metal pad and the first contact conductive layer. The isolation layer is formed on the second contact conductive layer, and the isolation layer has openings formed on the second contact conductive layer. The solder balls are welded on the openings and electrically coupled with the second contact conductive layer, respectively. The first die is selected from DSP die, acctive die, passive die, supprot die, CPU die or processor die, and the second die is a CMOS image sensor die. The image sensor die is packaged with the DSP die, acctive die, passive die, supprot die, CPU die or processor die with a stacking structure.

The present invention also provides a process of wafer level package. First, a first photo resist pattern is formed on metal pads of a plurality of dies on a wafer to cover the metal pads. A silicon-dioxide layer is formed on the first photo resist pattern and the plurality of dies. Then, the silicon-dioxide layer is cured. The first photo resist pattern is removed. The plurality of dies on the wafer is sawed to form individual dies. Next, the good dies are selected and attached to a isolating base. The isolating base is cured. A material layer is formed on the isolating base to fill in a space among the plurality of dies on the isolating base. The material layer is curied. A second dielectric layer is formed on the material layer and the metal pads. After that, a partial region of the second dielectric layer on the metal pads is etched to form first openings on the metal pads. The second dielectric layer is cured. A contact conductive layer is formed on the first openings to electrically couple with the metal pads, respectively. A second photo resist layer is formed on the second dielectric layer and the contact conductive layer. Then, a partial region of the second photo resist layer is removed to form a second photo resist pattern and expose the contact conductive layer to form second openings. The conductive lines are formed on the second photo resist pattern and the second openings and coupled with the contact conductive layer, respectively. The remaining second photo resist layer is removed. Following that, an isolation layer is formed on the conductive lines and the second dielectric layer. A partial region of the isolation layer on the conductive lines is removed to form third openings. The isolation layer is cured. Finally, the solder balls are welded on the third openings.

DESCRIPTION OF THE PREFERRED EMBODIMENT

Some sample embodiments of the invention will now be described in greater detail. Nevertheless, it should be recognized that the present invention can be practiced in a wide range of other embodiments besides those explicitly described, and the scope of the present invention is expressly not limited expect as specified in the accompanying claims.

Then, the components of the different elements are not shown to scale. Some dimensions of the related components are exaggerated and meaningless portions are not drawn to provide a more clear description and comprehension of the present invention.

The die of the present invention may be packaged with passive components (ex. capacitors) or other dies with a side by side structure or a stacking structure. The IC package can be finished by semiconductor industry and LCD industry.

Figure 1:
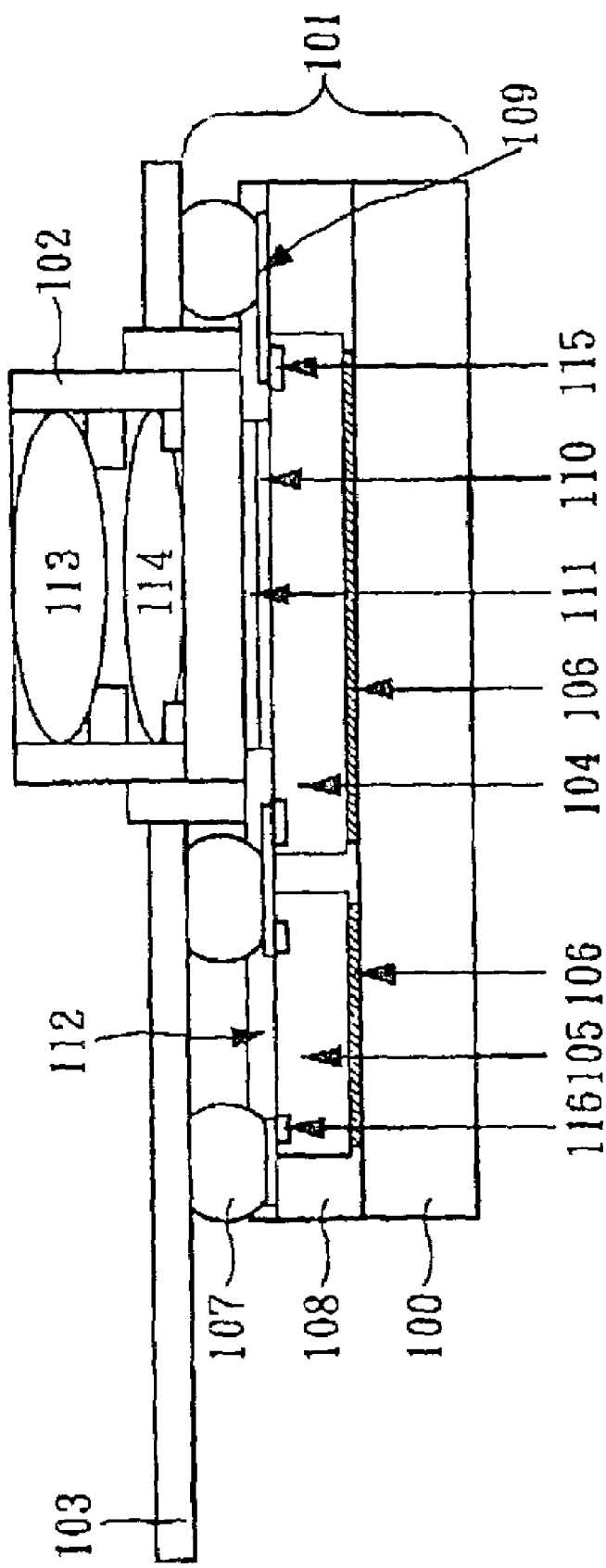
FIG. 1 is a schematic diagram of an image sensor module according to the present invention.

As aforementioned, the present invention provides an image sensor module, as shown in FIG. 1. The cross-section of the wafer level package structure of the present is indicated as 101. The image sensor module comprises an isolating base 100, a wafer level package 101, a lens holder 102, and a F.P.C.103. The material of the isolating base 100 can be glass, silicon, ceramic or quartz crystal materials etc., and even have a round or a rectangular shape. The wafer level package 101 has a plurality of image sensor dies 104 and the dies 105, for example digital signal process (DSP) dies, with a side by side structure. Note that the dies 105 are optionally disposed. The image sensor dies 104 may be CMOS image sensor dies. The dies 105 are selected from DSP die, acctive die, passive die, supprot die, CPU die or processor die etc.. The image sensor dies 104 and the dies 105 are packaged with a side by side structure. In the wafer level package 101, the image sensor dies 104 and the dies 105 are adhered to the isolating base 100 by an UV curing type and/or heat curing type adhesion material 106 with good thermal conductivity. The wafer level package 101 has a plurality of metal soldering balls 107 to be a signal transmitting mechanism. The metal soldering balls 107 may be solder balls 107.

A dielectric layer 108 is formed on the isolating base 100 and filled in a space except the image sensor dies 104 and the dies 105 on the isolating base 100. The material of the dielectric layer 108 may be silicon rubber.

A contact conductive layer 109 is formed on metal pads 115 of the image sensor dies 104 and metal pads 116 of the dies 105 to cover the metal pads 115,116. That is to say, the contact conductive layer 109 may be electrically coupled to the metal pads 115,116, respectively. The material of the contact conductive layer 109 may be selected from Ni, Cu, Au and the combination thereof.

Moreover, a film layer 110 can be covered on the image sensor dies 104. The material of the film layer 110 is (SiO$_2$) or Al$_2$O$_3$ formed by spin coating to be a protection film. The thickness of the film layer 110 is controlled less preferably 20 μm so that it can't affect the function of the image sensor dies 104. The film layer 110 may comprise a filtering film 111, for example IR filtering layer, formed on the film layer 110 to be a filter.

An isolation layer 112 is formed on the contact conductive layer 109, and the isolation layer 112 has openings on the contact conductive layer 109. The isolation layer 112 should not cover the image sensor dies 104 for conveniently sensing the image. The material of the isolation layer 112 is selected from epoxy, resin and the combination thereof.

Figure 5:
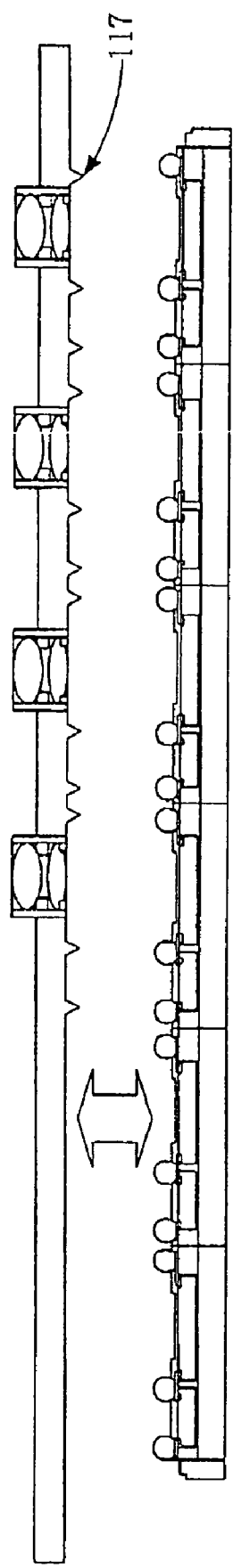
FIG. 5 is a schematic diagram of a final testing of multi-CSP according to the present invention.

The lens holder 102 is located on the image sensor dies 104, and lens 113,114 are placed in the lens holder 102. The lens holder 102 is placed in the F.P.C.103, and the F.P.C. 103 has a plurality of solder joints 117 coupling to the solder balls 107 for conveniently transmitting signal. Therefore, the combination of the lens holder 102 and the F.P.C.103 of the present invention has a function of probe card, and it can be used to be a final testing of the Multi-CSP, as shown in FIG. 5.

Figure 2:
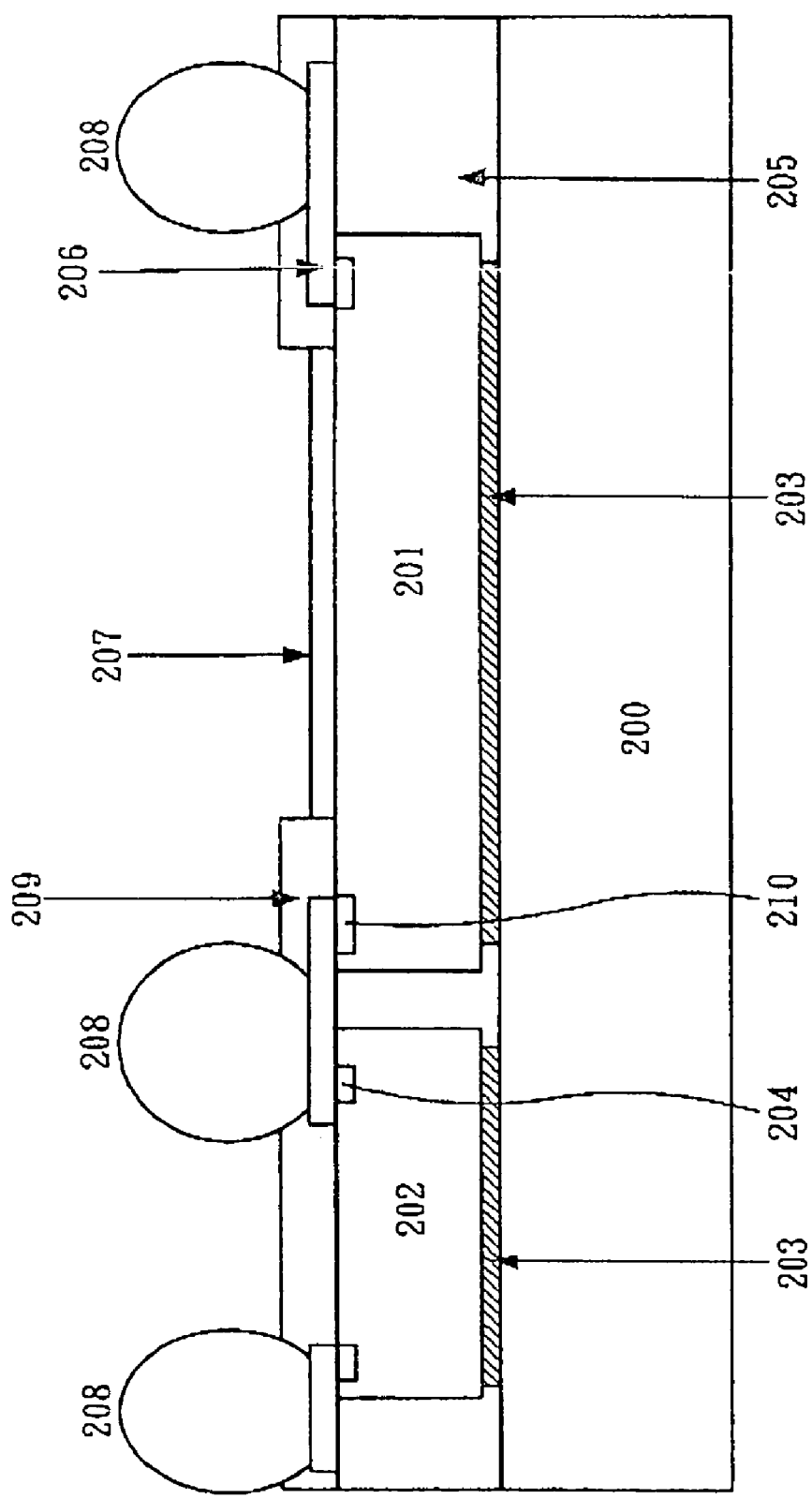
FIG. 2 is a schematic diagram of a package with a side by side structure according to the present invention.

As aforementioned, the present invention also provides a wafer level package structure, as shown in FIG. 2. The package structure comprises an isolating base 200, image sensor dies 201 and dies 202, a first dielectric layer 205, a second dielectric layer 207, contact conductive layer 206, an isolation layer 209 and solder balls 208. The material of the isolating base 200 can be glass, silicon, ceramic or quartz crystal etc., and even have a round or a rectangular shape. The image sensor dies 201 and the dies 202 are packaged with a side by side structure. The image sensor dies 201 and the dies 202 are adhered to the isolating base 200 by an UV curing type and/or heat curing type adhesion material 203 with good thermal conductivity. The first dielectric layer 205 is formed on the isolating base 200 and filled in a space except the image sensor dies 201 and the dies 202 on the isolating base 200. The material of the first dielectric layer 205 may be silicon rubber.

The second dielectric layer 207 is formed on the image sensor dies 201 to cover a sensing area of the image sensor dies 201. The material of the second dielectric layer 207 is $SiO_2$ to be a protection film. Besides, a filtering film may be formed on the second dielectric layer 207, and the filtering film is, for example IR filtering layer, to be a filter.

The contact conductive layer 206 is formed on metal pads 210 of the image sensor dies 201 and metal pads 204 of the dies 202 to cover the metal pads 210,204. Namely, the contact conductive layer 206 may be electrically coupled to the metal pads 210,204, respectively. The material of the contact conductive layer 206 may be selected from Ni, Cu, Au and the combination thereof. The metal pads 210,204 are, for example Al pads. The isolation layer 209 is formed on the contact conductive layer 206, and the isolation layer 209 has openings on the contact conductive layer 206. The material of the isolation layer 209 is selected from epoxy, resin, SINR(Siloxane polymer) or BCB. The metal soldering balls 208 are formed on the openings by welding method so that the metal soldering balls 208 are electrically coupled with the contact conductive layer 206, respectively. The metal soldering balls 208 may be solder balls 208.

The dies 202 may be selected from DSP die, acctive die, passive die, supprot die, CPU die or processor die, and the image sensor dies 201 are CMOS image sensor dies. The image sensor dies 201 are packaged with the dies 202 with a side by side structure.

Figure 3:
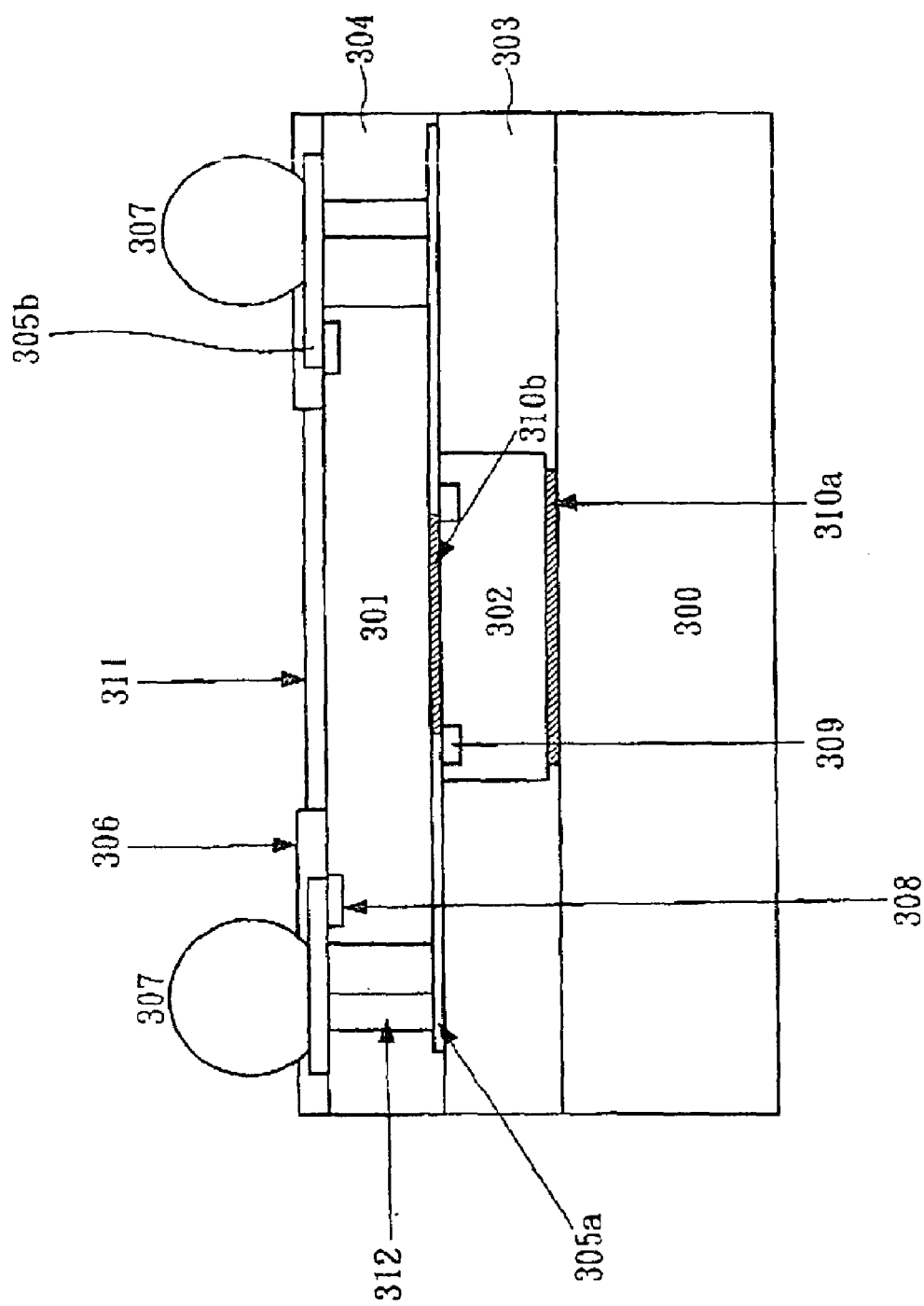
FIG. 3 is a schematic diagram of a package with a stacking structure according to the present invention.

Moreover, the present invention also provides an another wafer level package structure, as shown in FIG. 3. The dies, in one embodiment, are packaged with a stacking structure. The package structure comprises an isolating base 300, image sensor dies 301 and dies 302, a first dielectric layer 303, a second dielectric layer 304, a third dielectric layer 311, contact conductive layer 305a,305b, an isolation layer 306 and solder balls 307. The material of the isolating base 300 is glass, silicon, ceramic or quartz crystal etc., and even has a round or a rectangular shape. The image sensor dies 301 and the dies 302 are packaged with a stacking structure. The dies 302 are adhered to the isolating base 300 by an UV curing type and/or heat curing type adhesion material 310a with good thermal conductivity. The first dielectric layer 303 is formed on the isolating base 300 and filled in a space except the dies 302 on the isolating base 300. The material of the first dielectric layer 303 may be silicon rubber.

The contact conductive layer 305a is formed on metal pads 309 of the dies 302 to cover the metal pads 309 to electrically couple to the metal pads 309, respectively. The image sensor dies 301 are adhered to the dies 302 by an UV curing type and/or heat curing type adhesion material 310b with good thermal conductivity. The second dielectric layer 304 is formed on the first dielectric layer 303 and filled in a space except the image sensor dies 301, and the second dielectric layer 304 has via hole 312 formed on the contact conductive layer 305a. The material of the second dielectric layer 304 is $SiO_2$.

Besides, the third dielectric layer 311 is formed on the image sensor dies 301 to cover a sensing area of the image sensor dies 301. However, the third dielectric layer 311 should not affect function of the image sensor dies 301. The material of the third dielectric layer 311 is $SiO_2$ to be a protection film. Specially, a filtering film may be formed on the third dielectric layer 311 on the image sensor dies 301, and the filtering film is, for example IR filtering layer, to be a filter.

The contact conductive layer 305b is formed on metal pads 308 of the image sensor dies 301 and filled in the via hole 312 to cover the metal pads 308. Namely, the contact conductive layer 305b is electrically coupled to the metal pads 308 and the contact conductive layer 305a. The material of the contact conductive layer 305a,305b may be selected from Ni, Cu, Au and the combination thereof. The metal pads 308,309 are, for example Al pads. The isolation layer 306 is formed on the contact conductive layer 305b, and the isolation layer 306 has openings on the contact conductive layer 305b. The material of the isolation layer 306 is selected from epoxy, resin and the combination thereof.

The metal soldering balls 307 are formed on the openings by welding method so that the metal soldering balls 307 are electrically coupled with the contact conductive layer 305b, respectively. The metal soldering balls 307 may be solder balls 307.

The dies 302 may be selected from DSP die, acctive die, passive die, supprot die, CPU die or processor die, and the image sensor dies 301 are CMOS image sensor dies. The image sensor dies 301 are packaged with the dies 202 with a stacking structure.

FIG. 4A to FIG. 4J are schematic diagrams of a method for manufacturing of wafer level package according to the present invention.

Figure 4A:
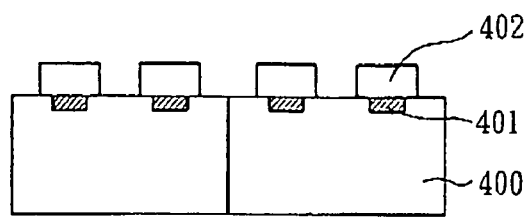
FIG. 4A to FIG. 4J are schematic diagrams of a method for manufacturing of wafer level package according to the present invention.
Figure 4B:
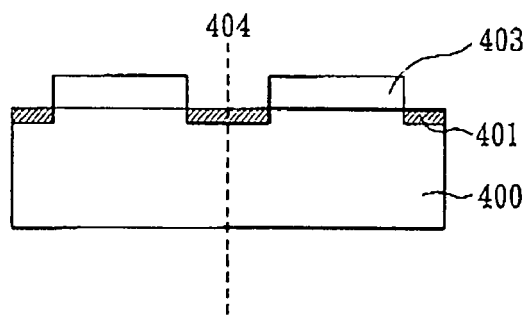

Moreover, the present invention provides a process of wafer level package. First, a first photo resist pattern 402 is formed on metal pads 401 of a plurality of dies 400 on a wafer to cover the metal pads 401, as shown in FIG. 4A. A first dielectric layer is formed on the first photo resist pattern 402 and the dies 400. Then, the first dielectric layer is cured. The first photo resist pattern 402 is removed to form a dielectric layer 403. The material of the dielectric layer 403 is $SiO_2$ by spin coating method to be a protection film. The plurality of dies 400 on the wafer is sawed along the sawing line 404 to form individual dies, as shown in FIG. 4B. Specially, a filtering film may be formed on the dielectric layer 403, and the filtering film is, for example IR filtering layer, to be a filter, as referring to above embodiment.

A step of back lapping the processed silicon wafer is used to get a thickness of the wafer around 100–300 μm after the step of removing first photo resist pattern 402. The processed silicon wafer with the aforementioned thickness is easily sawed to divide the dies 400 on the wafer into respective dies. The back lapping step may be omitted if the processed silicon wafer is not hard to saw without back lapping. The dies 400 comprise at least two types of dies.

Figure 4C:
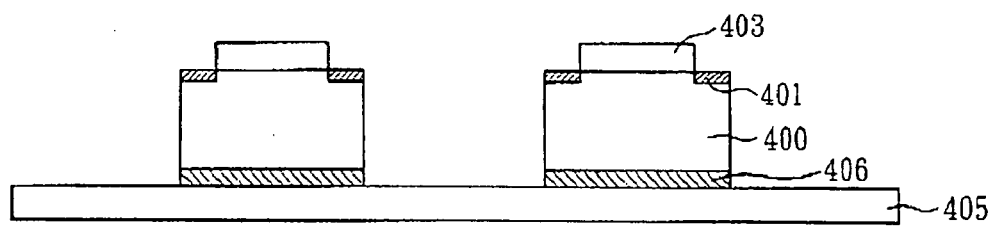

Next, the divided dies are tested to choose standard good dies 400 there from. The standard good dies 400 are picked and replaced onto an isolating base 405 with a wider distance between two adjacent dies and adhered to the isolating base 405 with an UV curing type and/or heat curing type adhesion material 406 with good thermal conductivity. The isolating base 405 is cured by UV light or thermal, as shown in FIG. 4C. The adhesion material 406 is coating on the isolating base 405, and the thickness of the adhesion material 406 is preferably 20–60 µm. The material of the isolating base 405 can be glass, silicon, ceramic, crystal materials etc., and even have a round or a rectangular shape.

The dies 400 have I/O pads 401 on the upper surface. The adhesive material 406 of the present invention is preferably good thermal conductive material, so the problems (such as stress) resulted from the temperature difference between the dies 400 and the isolating base 405 can be avoided.

Figure 4D:
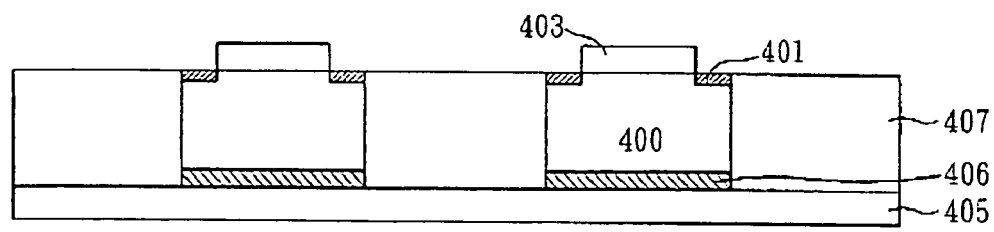

A material layer 407 is formed on the isolating base 405 to fill in the space among the die 400 and adjacent dies 400, and the surface of the material layer 407 and the surface of the die 400 are at same level, as shown in FIG. 4D. The material of the material layer 407 can be UV curing type or heating curing type material. Then, the material layer 407 is cured by UV or thermal. The material layer 407 may be formed by a screen printing method or a photolithography method. The material layer 407 functions as a buffer layer to reduce a stress due to temperature, etc. The material layer 407 can be an UV and/or heat curing material, such as silicon rubber, epoxy, resin, BCB, and so on.

A second dielectric layer is coated on the material layer 407 and metal pads 401. The material of the second dielectric layer can be $SiO_2$.

Figure 4E:
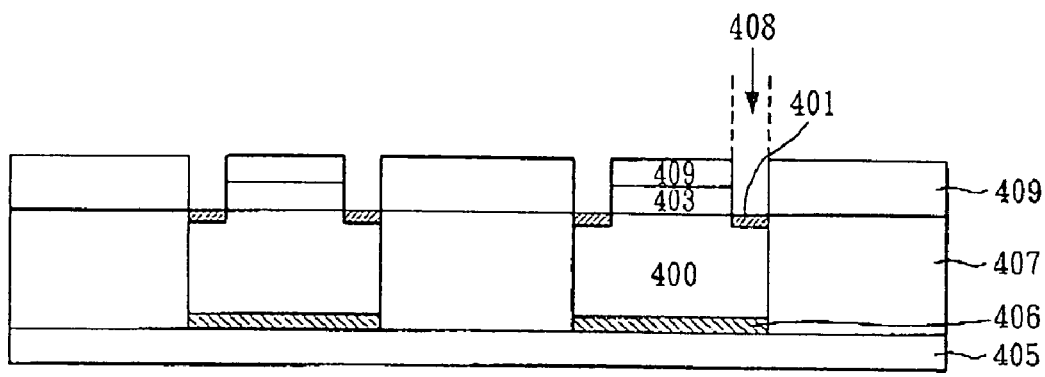

Then, the partial area of the second dielectric layer on the metal pads 401 is removed by using a photo mask to form first openings 408 on the metal pads 401, and then the dielectric layer 409 is cured by UV or heating, as shown in FIG. 4E. Next, the plasma etching (RIE) can be used optionally to clean the surface of the metal pads 401 to make sure no residual materials on the metal pads 401.

Figure 4F:
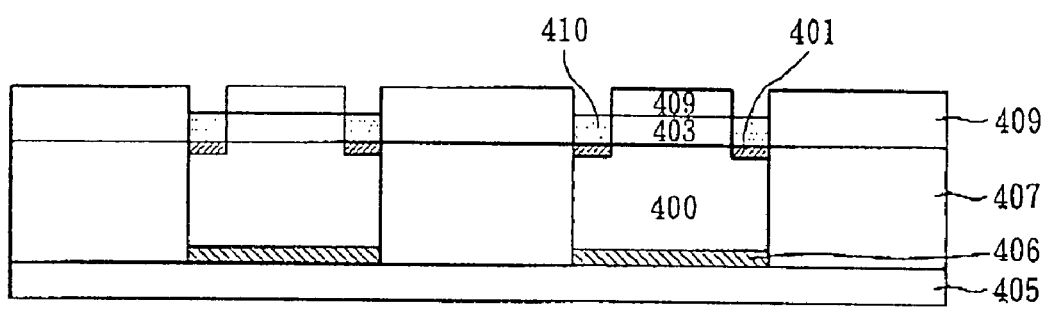

The contact conductive layer 410 is formed on the first openings 408 to electrically couple with the metal pads 401 respectively, as shown in FIG. 4F. The preferable material of the contact conductive layer 410 is Ti, Cu, or the combination thereof. The contact conductive layer 410 can be formed by a physical method, a chemical method, or the combination thereof, for example: CVD, PVD, sputter, and electroplating.

Figure 4G:
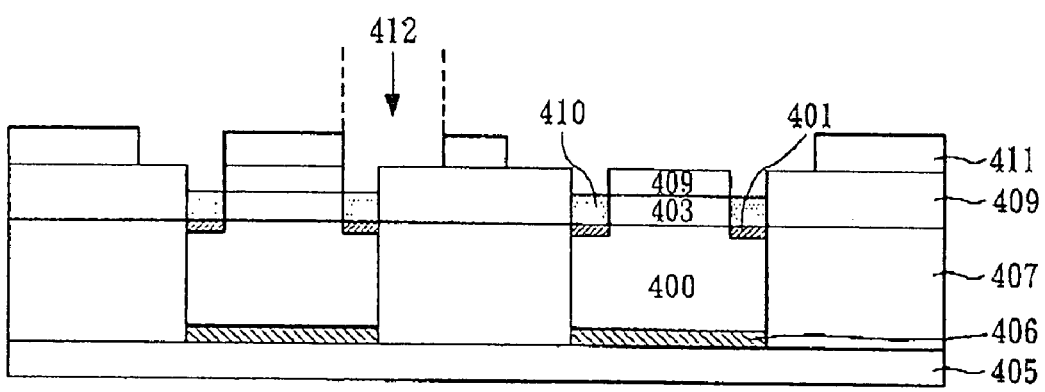

A second photo resist layer is formed on the dielectric layer 409 and the contact conductive layer 410. And then, a partial region of the second photo resist layer is exposed and developed by using a photo mask to form a second photo resist pattern 411 and expose the contact conductive layer 410 to form second openings 412, as shown in FIG. 4G.

Figure 4H:
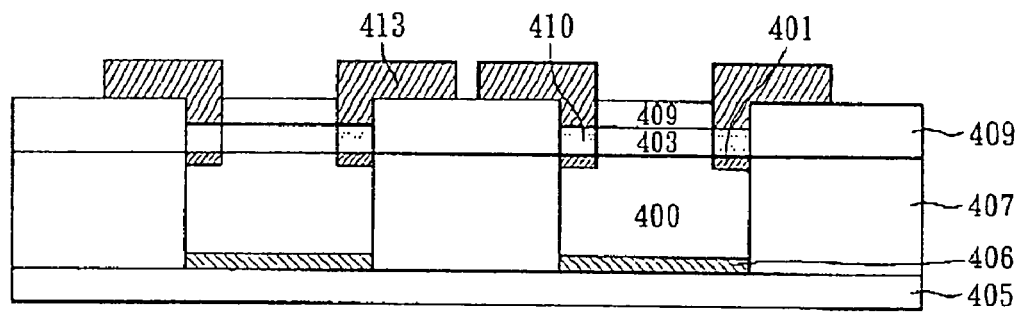

Then, conductive lines 413 by electroplating method are formed on the second openings 412 to couple with the contact conductive layer 413 respectively, as shown in FIG. 4H. The material of the conductive lines 413 are preferably Cu, Ni, Au, or the combination thereof. The conductive lines 413 are called re-distribution layer (RDL).

Figure 4I:
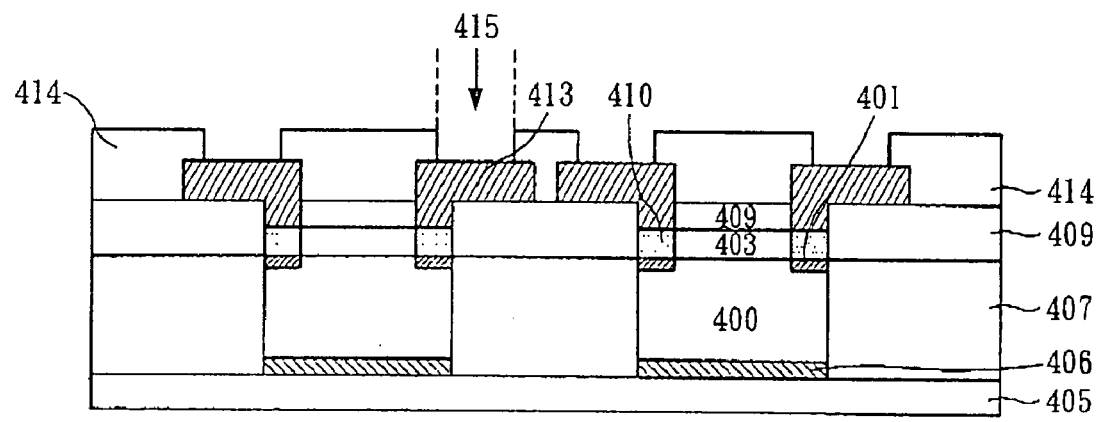

The remaining second photo resist layer 411 is removed. An isolation layer is formed on the conductive lines 413 and the dielectric layer 409. A partial region of the isolation layer is removed to form a isolation layer 414 and third openings 415 on the conductive lines 413, as shown in FIG. 4I. The isolation layer can be formed by a spin coating method or a screen printing method.

The present invention may optionally comprises a step of forming an epoxy layer (not shown) on back surface of the isolating base 405.

Figure 4J:
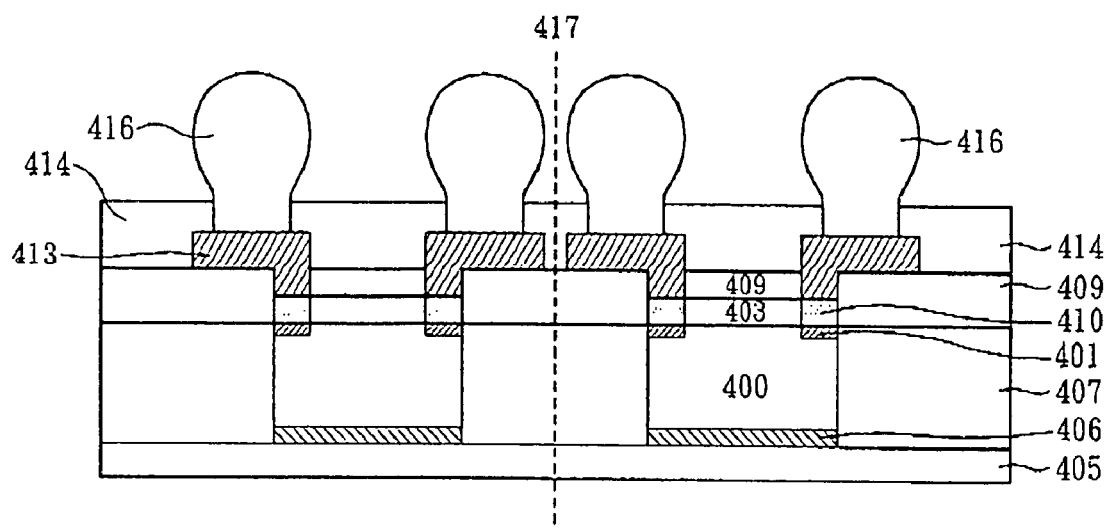

The isolation layer 414 is cured. Solder balls 416 are formed on the third openings 415, as shown in FIG. 4J. The solder balls 416 may be placed on the third openings 415 by a screen printing method and the solder balls 416 joined together with surfaces of the conductive lines 413 by an IR reflow method.

Finally, the isolating base 405 is sawed along the sawing line 417 to separate individual IC package.

Therefore, the image sensor module and wafer level package of the present invention can lower the cost of the package structure and raise the yield of the package structure. Moreover, the package size of the present invention can be easily adjusted to test equipment, package equipment, etc..

Figure 6:
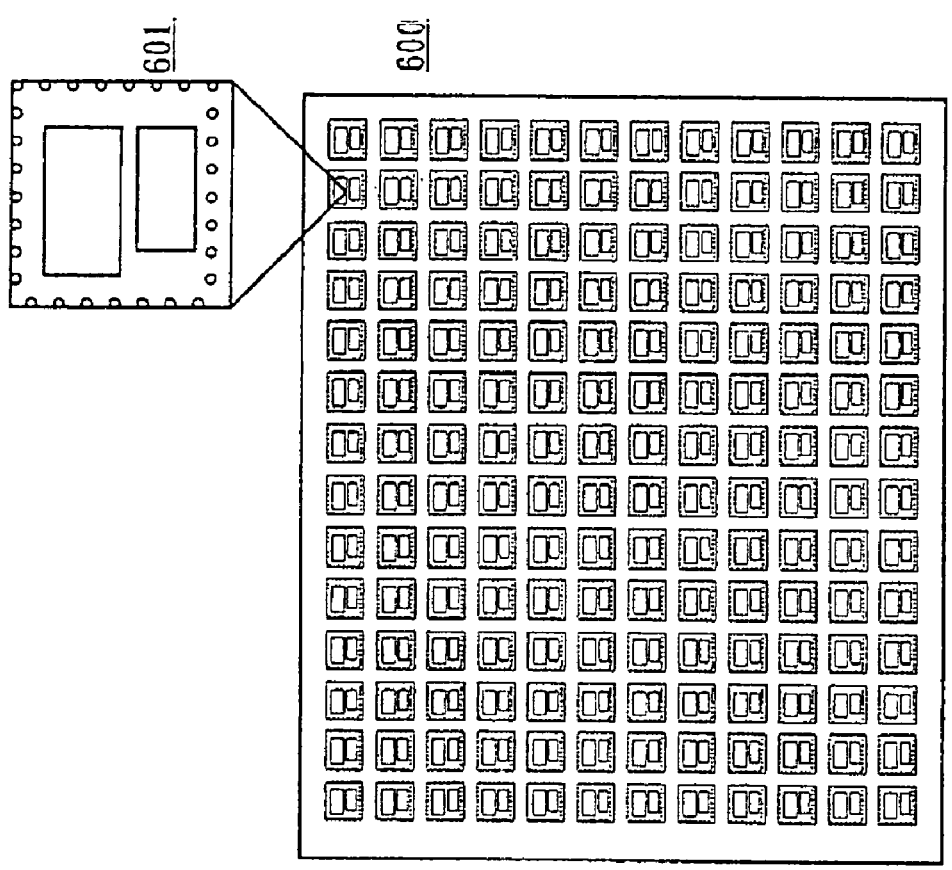
FIG. 6 is a schematic diagram of an application for LCD industry according to one embodiment of the present invention.

Moreover, the present invention can be applied for packaging of semiconductor equipment and for IC packaging of LCD equipment. FIG. 6 is a schematic diagram of an application for LCD industry according to one embodiment of the present invention. The chip scale packages (CSP's) 601 are formed on glass base 600.

Although specific embodiments have been illustrated and described, it will be obvious to those skilled in the art that various modifications may be made without departing from what is intended to be limited solely by the appended claims.

What is claimed is:

1. A image sensor module, comprising:
    an isolating base;
    an image sensor die having a plurality of solder balls, attached to said isolating base;
    a protection film formed on said image sensor die;
    a lens holder having a plurality of lens, located on said image sensor die; and
    a F.P.C. having a plurality of conductive solder joints coupled to said solder balls for conveniently transmitting signal of said image sensor die, wherein said lens holder is placed in said F.P.C..

2. The module in claim 1, wherein said protection film is $SiO_2$ or $Al_2O_3$ formed by spin coating.

3. The module in claim 1, wherein said image sensor module comprises a second die packaged with said image sensor die with a side by side structure or a stacking structure.

4. The module in claim 3, wherein said second die is selected from DSP die, acctive die, passive die, supprot die, CPU die or processor die.

5. The module in claim 1, wherein material of said isolating base is glass, silicon, ceramic or quartz crystal.

6. The module in claim 3, further comprising;
    a first dielectric layer formed on said isolating base and filled in a space except said image sensor die and said second die on said isolating base;
    a second dielectric layer formed on said second die;
    a contact conductive layer formed on a first metal pad of said image sensor die and a second metal pad of said second die to cover said first metal pad and second metal pad, said contact conductive layer electrically coupling to said first metal pad and second metal pad, respectively;
    an isolation layer formed on said contact conductive layer, and said isolation layer having openings on said contact conductive layer; and
    solder balls welded on said openings and electrically coupling with said contact conductive layer, respectively.

7. The module in claim 1, wherein said image sensor die is CMOS image sensor die.

8. The module in claim 1, further comprising a filtering film formed on said protection film.

9. The module in claim 6, wherein material of said first dielectric layer is silicon rubber.

10. The module in claim 6, wherein material of said second dielectric layer is epoxy, SINR(Siloxane polymer)or BCB.

11. The module in claim 8, wherein said filtering film ia an IR filtering layer.

12. The module in claim 6, wherein material of said contact conductive layer is selected from Ni, Cu, Au and the combination thereof.

13. The module in claim 6, wherein material of said isolation layer is selected from epoxy, resin, Silicon Rubber and the combination thereof.

14. The module in claim 3, further comprising;
- a first dielectric layer formed on said isolating base and filled in a space except said second die on said isolating base;
- a first contact conductive layer formed on a first metal pad of said second die to entirely cover said first metal pad, said first contact conductive layer electrically coupling to said first metal pad;
- an image sensor die stacking and attaching to said second die;
- a second dielectric layer formed on said first dielectric layer and filled in a space except said image sensor die, said second dielectric layer having via hole formed on said first contact conductive layer;
- a third dielectric layer formed on said image sensor die;
- a second contact conductive layer formed on a second metal pad of said image sensor die and filled in said via hole to cover said second metal pad, said second contact conductive layer electrically coupling to said second metal pad and said first contact conductive layer;
- an isolation layer formed on said second contact conductive layer, and said isolation layer having openings on said second contact conductive layer; and
- solder balls welded on said openings and electrically coupling with said second contact conductive layer, respectively.

15. The module in claim 14, wherein material of said first dielectric layer is silicon rubber.

16. The module in claim 14, wherein material of said second dielectric layer is polyimide (PI), BT SINR, or epoxy.

17. The module in claim 14, wherein material of said second dielectric layer is polyimide (PI), BT or SINR (Siloxane polymer).

18. The module in claim 14, wherein material of said first and second contact conductive layer is selected from Ni, Cu, Au and the combination thereof.

19. The module in claim 14, wherein material of said isolation layer is selected from epoxy, resin and the combination thereof.

* * * * *